(12) United States Patent
Alon (10) Patent No.: US 7,178,091 B1
(45) Date of Patent: Feb. 13, 2007

(54) REED SOLOMON ENCODER

(75) Inventor: Moshe Alon, Herzlia (IL)

(73) Assignee: National Semiconductor Corporation, Santa Clara, CA (US)

(*) Notice: Subject to any disclaimer, the term of this patent is extended or adjusted under 35 U.S.C. 154(b) by 378 days.

(21) Appl. No.: 10/192,761

(22) Filed: Jul. 10, 2002

Related U.S. Application Data (60) Provisional application No. 60/304,286, filed on Jul. 10, 2001.

(51) Int. Cl.
 *H03M 13/00* (2006.01)

(52) U.S. Cl. ............... 714/784; 714/781; 708/492

(58) Field of Classification Search ............ 714/784, 714/774
See application file for complete search history.

(56) References Cited

U.S. PATENT DOCUMENTS

| | | | |
|---|---|---|---|
| 4,037,093 A * | 7/1977 | Gregg et al. | 708/492 |
| 4,251,875 A * | 2/1981 | Marver et al. | 708/492 |
| 4,567,568 A | 1/1986 | Inagawa et al. | |
| 4,777,635 A * | 10/1988 | Glover | 714/756 |
| 4,847,801 A * | 7/1989 | Tong | 708/492 |
| 4,994,995 A | 2/1991 | Anderson et al. | |
| 5,502,665 A * | 3/1996 | Im | 708/492 |
| 6,209,114 B1 * | 3/2001 | Wolf et al. | 714/784 |
| 6,493,845 B1 * | 12/2002 | Shen et al. | 714/784 |
| 6,701,336 B1 * | 3/2004 | Shen et al. | 708/492 |
| 6,760,742 B1 * | 7/2004 | Hoyle | 708/492 |
| 2003/0041300 A1 * | 2/2003 | Burns et al. | 714/784 |

FOREIGN PATENT DOCUMENTS

JP    62254525 A * 11/1987

OTHER PUBLICATIONS

Comtributing Author. "Use Forward Error Correction to Improve Data Communications." Electronic Design. Penton Media. Aug. 21, 2000. pp. 1,3.*

* cited by examiner

*Primary Examiner*—Albert Decady
*Assistant Examiner*—Steve Nguyen (57) ABSTRACT

An Reed-Solomon encoder and method for block-code encoding by performing a plurality of Galois-Field (GF) multiplication operations utilizing a single GF multiplier. The multiplier generates a set of partial products that are used to calculate all the multiplication operations required for the encoding.

20 Claims, 5 Drawing Sheets

REED SOLOMON ENCODER

CROSS-REFERENCE TO RELATED APPLICATIONS

This application claims priority to U.S. provisional application No. 60/304,286 filed on Jul. 10, 2001, and which is hereby incorporated by reference.

FIELD OF THE INVENTION

The present invention relates to the field of block code encoders. More particularly, the invention relates to a method and apparatus for a Galois field multiplication in block code encoding.

BACKGROUND OF THE INVENTION

The Reed Solomon (RS) code is widely used for error detection and correction in many applications in which transmitted data is likely to be corrupted by noise or other error sources (e.g., cellular phones, satellite communications, CD players). The RS code is a block code. In such codes, a fixed number of information symbols are utilized to generate a predefined number of check symbols that are added to the information symbols to generate a code word.

RS codes are usually referred to as RS (n,k) codes, wherein n is the total number of symbols comprising a code word, and k is the number of information symbols in the code word. In systematic codes, a code word is formed from k information symbols and trailing check symbols, i.e., the information symbols are transmitted prior to the check symbols. The check symbols are generated utilizing the k information symbols, and are actually the parity information of the information symbols.

The generation of an RS code is based on Galois Field (GF) arithmetic, the size of the GF being determined by the number of bits per symbol, e.g., codes in which a symbol is comprised from m bits are based on a GF of size $n=2^m$, and are signed as follows, $GF(2^m)$. The order of the GF elements is defined by the field polynomial, which is normally specified using a conventional polynomial representation. In GFs, it is customary to represent the code symbols in the form of polynomials, wherein the Most Significant Bit (MSB) is utilized as a coefficient for the polynomial term of the highest order, and the Least Significant Bit (LSB), for the coefficient of the polynomial term of the lowest order.

Throughout the following discussion, the encoding process will be described in terms of polynomial manipulations. To prevent confusion, polynomials that utilize symbols as their coefficients (symbol level polynomials) will be represented as functions of >z'. Polynomials that utilize binary bits as their coefficients (bit level polynomials) will be represented as functions of >x'.

In GFs, arithmetic addition and multiplication are carried out as follows: addition (and subtraction) is performed as an Exclusive OR (XOR) operation; and multiplication of two symbols is calculated as the multiplication result modulo the field polynomial, such that multiplication of two polynomials $a_{(x)}$ and $g_{(x)}$ over a GF with a field polynomial $f_{(x)}$ equals $(a_{(x)} \cdot g_{(x)}) \bmod f_{(x)}$.

The generation of the RS code check symbols (also known as parity symbols) is carried out utilizing a generator polynomial $$G_{(z)} = \sum_{j=0}^{n-k-1} g_j \cdot z^j$$

which is of order n−k−1. If representing the information symbols of a code word as the polynomial $$I_{(z)} = \sum_{q=0}^{k-1} i_q \cdot z^q$$

i.e., a code word consisting of k information symbols $i_q$, $(q=0, 1, Y, k-1)$, then the calculation of the code word check symbols in a systematic RS code is carried out as follows—

$$p_{(z)} = (I_{(z)} \cdot z^{n-k})_{\bmod G(z)} \qquad (*)$$

wherein $p_{(z)}$ is the polynomial representing the parity symbols. There are a large number of available coding algorithms and techniques that carry out the finite field arithmetic disclosed in equation ($^*$), but due to performance requirements, it is necessary to develop these algorithms in hardware rather than software (hardware implementations are substantially faster than the software implementations).

One method for a GF multiplier is disclosed in U.S. Pat. No. 4,567,568 wherein the GF multiplication is based on a so-called look-up table method. Such methods take advantage of the finite nature of GFs. Because the number of elements in a GF is finite, and since any multiplication result also belongs to the GF, a look-up table of multiplication of all of the field elements may be constructed and stored in a memory device. These types of methods are attractive for software implementation. Hardware implementations of such methods, however, are complex and burdensome, and generally unacceptable.

Figures 1, 6, 7:
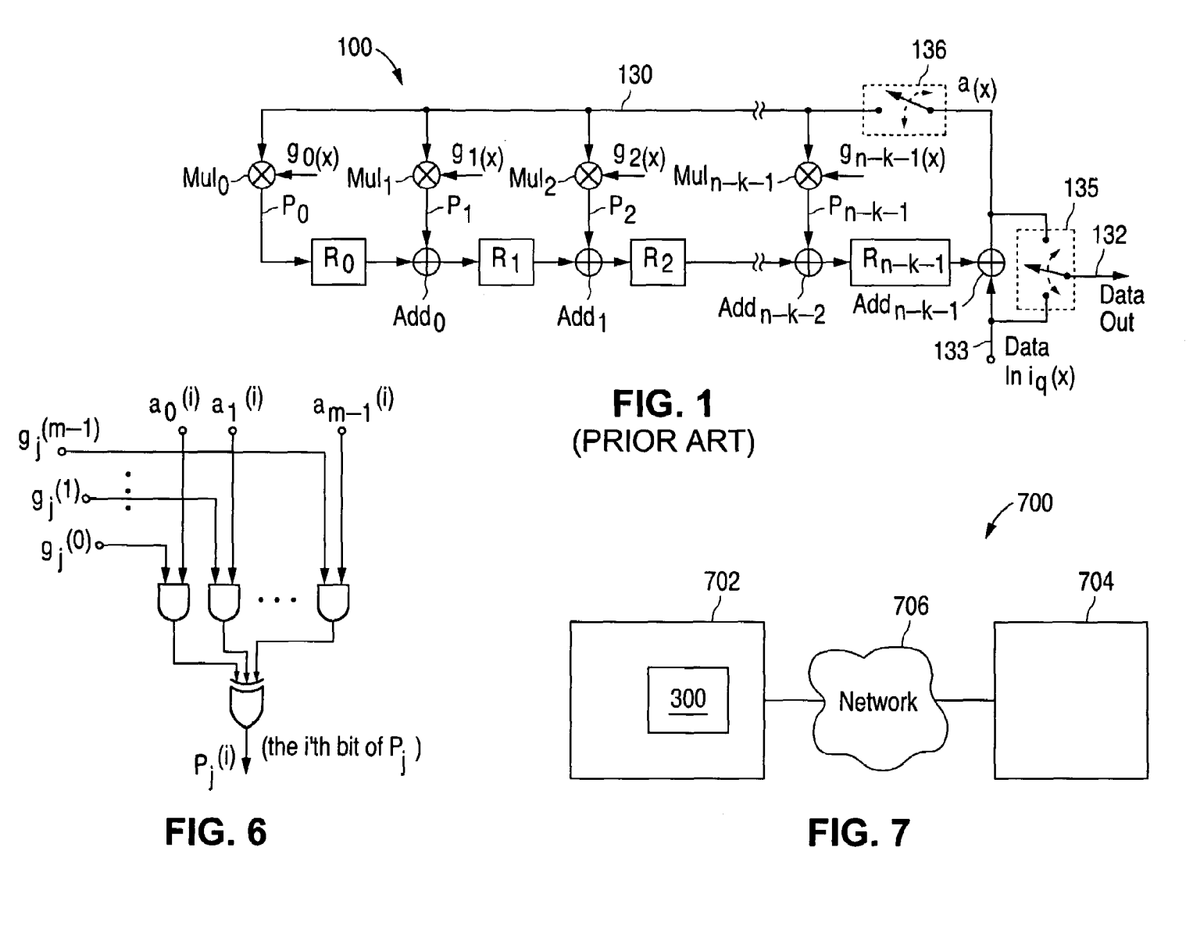
FIG. 1 schematically illustrates a conventional Reed-Solomon encoder for an RS(n-k) code over GF($2^m$)
FIG. 6 schematically illustrates the structure of the "Enable and XOR" units as implemented in the present invention.
FIG. 7 is a block diagram of a communication system utilizing an RS encoder in accordance with the present invention.

FIG. 1 schematically illustrates the conventional architecture for a systematic RS(n,k) encoder 100, the so-called "parallel encoder". The encoder 100 is designed to generate m bit symbols, utilizing the information symbols, which are also m bits in length. The check symbols generation is performed according to the finite field arithmetic operations that are disclosed in equation ($^*$), over the $GF(2^m)$ defined by the field polynomial $f_{(x)}$.

The check symbols calculation is performed through a series of multipliers $Mul_0$–$Mul_{n-k-1}$, and adders $Add_0$–$Add_{n-k-1}$. Each of the registers $R_0$–$R_{n-k-1}$, can hold an m bit symbol. The registers $R_0$–$R_{n-k-1}$, are connected in series, a connection that forms a so-called stage shift register. Between any two consecutive registers, there are XOR gates, which are numerated as $Add_0$–$Add_{n-k-1}$, for finite field addition. The finite field multipliers $Mul_0$–$Mul_{n-k-1}$, perform multiplication of the feedback signal $a_{(x)}$ present on a line 130 and the RS (n,k) generator polynomial coefficients, $g_{0(x)}, g_{1(x)}, Y, g_{n-k-1(x)}$ (these are all m bit symbols). The result of the multiplication $P_0$–$P_{n-k-1}$ is input to the adders $Add_0$–$Add_{n-k-1}$.

An arbitration mechanism 135 is utilized to select the first k information symbols at an encoder input 133 to be transmitted prior to the check symbols through an encoder output 132. Another arbitration mechanism 136 is utilized to provide the feedback signal on the feedback line 130 to the encoder multipliers $Mul_0$–$Mul_{n-k-1}$ (i.e., in the conducting state while the information symbols are input). Each information symbol that enters the encoder is transmitted on the encoder output 132, and at the same time used to calculate the feedback signal on the line 130 by the addition (performed by $Add_{n-k-1}$) with the content of the last register $R_{n-k-1}$.

The check symbol calculation is carried out by feeding the encoder "Data In" input 133 with the information symbols, $i_{q(x)(q=0, 1, Y, k-1)}$, one at a time. As the information symbols are fed into the encoder 100 at the input 133, the corresponding feedback signal $a_{(x)}$ is determined by the adder $Add_{n\cdot k-1}$, and applied on the feedback line 130. The feedback signal on 130 is multiplied in the encoder multipliers $Mul_0$–$Mul_{n-k-1}$ by each of the RS generator polynomial coefficients $g_{0(x)},g_{1(x)},Y,g_{n-k-1(x)}$. The multiplication result is then introduced to the adders $Add_0$–$Add_{n-k-2}$ (except for the output from $Mul_0$, which is fed directly to $R_0$), which performs addition with the content of the registers $R_0$–$R_{n-k-2}$.

After all the information symbols have entered the encoder 100, the encoder registers $R_0$–$R_{n-k-1}$ are set to the values of the registers $R_0$–$R_{n-k-1}$ content (i.e. the check symbols), the arbitration mechanisms 135 and 136 change state to cut off the feedback signal on the line 130 from entering the multipliers $Mul_0$–$Mul_{n-k-1}$, and enable the transmission of the check symbols on the output 132 through register $R_{n-k-1}$ and the adder $Add_{n-k-1}$. At this stage, the encoder input is fed with n–k zero symbols so that the encoder performs as a regular shift register.

Figure 2:
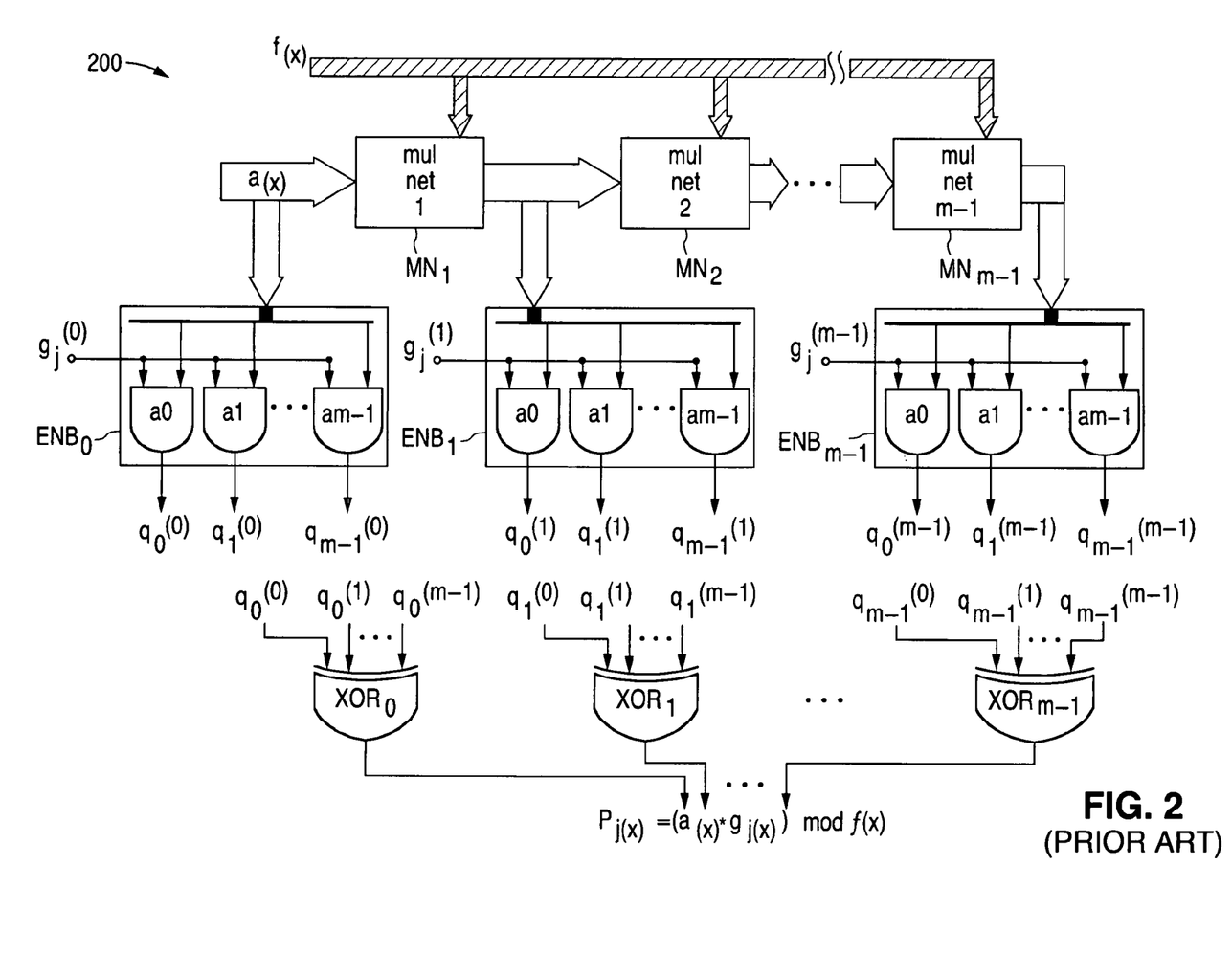
FIG. 2 schematically illustrates a conventional Galois-field multiplier.

A conventional Galois multiplier 200 is schematically illustrated in FIG. 2. The multiplier 200 receives two polynomials (each polynomial being an m bit symbol) as inputs. To exemplify the encoder multiplier, the input polynomials are taken to be the feedback signal $a_{(x)}$ and one of the RS code polynomial coefficient $g_{j(x)}$ (the bits comprising the coefficient $g_{j(x)}$ are designated as $g_j^{(0)}, g_j^{(1)}, \gamma, g_j^{(m-1)}$). The multiplier output is the finite field multiplication result, $p_{j(x)} = (a_{(x)} \cdot g_{(x)}) \bmod f_{(x)}$, wherein $f_{(x)}$ is the $GF(2^m)$ polynomial. The method utilized in multiplier 200 is based on the summation of the partial products:

$$p_{j(x)} = a(x) \cdot \sum_{l=0}^{m-1} g_j^{(l)} x^l \bmod f(x)^l$$

$$= g_j^{(0)}[a(x)x^0]_{\bmod f(x)} + g_j^{(l)}[a(x)x^1]_{\bmod f(x)} + \ldots + g_j^{(m-1)}[a(x)x^{m-1}]_{\bmod f(x)}$$

The partial products, $[a_j^{(l)}x^l]_{\bmod f(x)}$ are performed utilizing the blocks $[[MN_0,]] MN_1,Y, MN_{m-1} [[-1]]$, which will be referred herein after as Multiplication Networks (MN). The operation and structure of the MNs are fairly well known in the art and described in U.S. Pat. No. 4,037,093. Therefore, the structure and operation will not be discussed in detail, for purposes of brevity. The MN outputs and the bits comprising the code polynomial coefficients $g_{j(x)}$ (0 [[529 ]]≌. $j$ [[l ]]≌ $n-k-1$), $g_j^{(0)}, g_j^{(1)}, \gamma, g_j^{(m-1)}$, are multiplied in the $ENB_0$–$ENB_{m-1}$ units utilizing the logical AND gates, $a_0$–$a_{m-1}$. The output of the $ENB_0$–$ENB_{m-1}$ units is now added in LSB to MSB order by the adders, $XOR_0$–$XOR_{m-1}$, wherein $XOR_0$ generates the LSB of $p_{j(x)}$ (i.e., $p_j^{(0)}$), and $XOR_{m-1}$ generates the MSB of $p_{j(x)}$ (i.e., $p_j^{(m-1)}$).

In a conventional RS(n,k) encoder having symbols of m bits, the number of multipliers 200 is n–k. In each multiplier 200 there are m–1 MNs. The MNs comprise XOR gates, which are complex and costly implementations in terms of hardware means. It is therefore desirable to reduce the number of XOR gates required in such implementations. Additionally, in a conventional RS encoder, the parallel operation of the system allows no flexibility in the determination of the encoding rate, other than changing the clock pulse rate.

All the methods described above for the conventional RS encoder implementations utilizing GF multipliers generally require high numbers of gates. Accordingly, there exists a need for an RS encoder and method of block encoding utilizing a single GF multiplier to perform a plurality of GF multiplication operations.

SUMMARY OF THE INVENTION

According to one aspect of the present invention, there is provided an apparatus for encoding data. The apparatus includes an input for receiving a plurality of m-bit information symbols, an RS encoder for generating a code word having a plurality of m-bit information symbols and at least one m-bit check symbol, and an output for outputting the code word. The RS encoder includes a stage shift register having at least one register and at least one adder, and a single Galois Field (GF) multiplier.

In another aspect of the present invention, there is provided a communication device operable for communicating with a network, whereby the communications device including the apparatus as described above.

According to another aspect of the present invention, there is provided an RS(n,k) encoder, operating with a single Galois-Field (GF) multiplier, for performing m-bit symbol multiplication over $GF(2^m)$ with a field polynomial $f_{(x)}$. The encoder includes an input for receiving a plurality of symbols $I_{(x)}$ and an ordered set of n–k $GF(2^m)$ adders ($Add_0, Add_1,Y, Add_{n-k-1}$), each adder having a first input, a second input and an output, the ordered set of adders connected to an ordered set of n–k m-bit registers ($R_0, R_1,Y, R_{n-k-1}$) having an input and output. The adders and registers are configured such that the output of each register ($R_0, R_1,Y, R_{n-k-1}$) is coupled to the second input of each $GF(2^m)$ adder ($Add_0, Add_1,Y, Add_{n-k-1}$), respectively, and the output of each adder ($Add_0, Add_1,Y, Add_{n-k-2}$) is coupled to the second input of each register ($R_1,Y, R_{n-k-1}$), respectively, and the first input of $Add_{n-k-1}$ is connected to the input $I_{(x)}$. A first arbitration device having an input coupled to the output of adder $Add_{n-k-1}$ and an output connected to the input of the GF multiplier, outputs the output symbol $a_{(x)}$ when in a first state and outputs zero when in a second state. The GF multiplier is operable for simultaneously multiplying the output symbol $a_{(x)}$ with each coefficient $g_{i(x)}$ of a generator polynomial G(z). The GF multiplier includes (1) an ordered set of m–1 multiplication apparatus ($MN_1$–$MN_{m-1}$) wherein the output of the $i^{th}$ multiplication apparatus $(_{MNs})$ is $a_{i(x)} = a_{(x)} \cdot x^i \bmod f_{(x)(i=1,2,\ldots,m-1)}$, (2) an ordered set of n–k multiplication means each yielding a multiplication result $p_{j(x)} = g_{j(x)} \cdot a_{j(x)} \bmod f_{(x)(j=0,1,\ldots,n-k-1)}$ which is the product between the j'th coefficient of the code generating polynomial $g_{j(x)}$ and the output symbol $a_{(x)}$, and (3) means for coupling the output of each of the n–k–1 multiplication means $p_{j(x)(j=1,2,\ldots,n-k-1)}$ to the first input of each $GF(2^m)$ adder ($Add_0, Add_1,Y, Add_{n-k-2}$), respectively, and for coupling the output of $p_{0(x)}$ to the input of the register $R_0$. A second arbitration device having a first input coupled to the input $I_{(x)}$ and second input coupled to the output of the adder $Add_{n-k-1}$ outputs the input $I_{(x)}$ in a first state and the output of the adder $Add_{n-k-1}$ in a second state.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

DETAILED DESCRIPTION OF THE DRAWINGS

Figure 3:
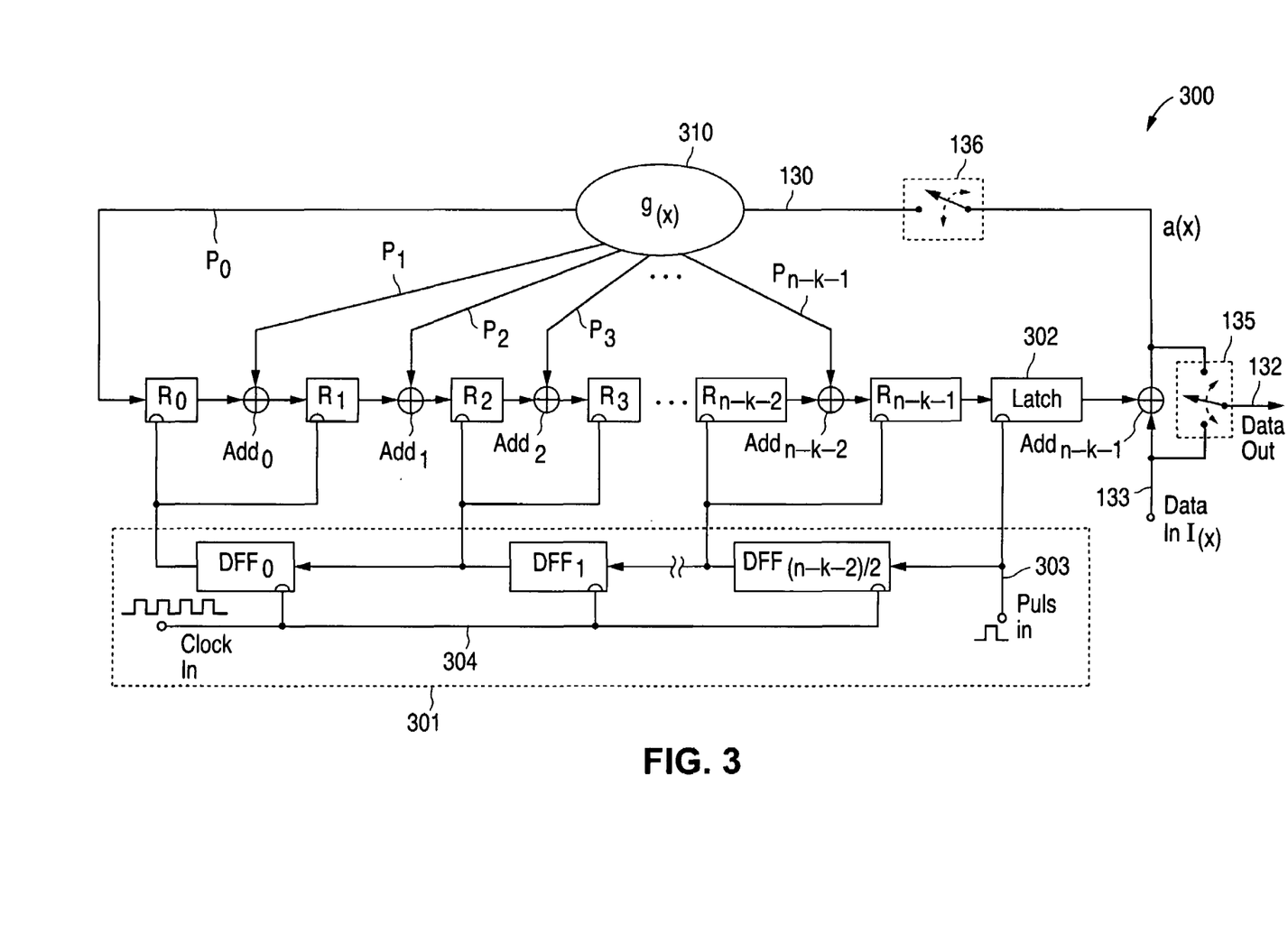
FIG. 3 schematically illustrates a Reed-Solomon encoder utilizing a single Galois-field multiplier in accordance with the present invention.

FIG. 3 schematically illustrates one embodiment of the present invention for an RS(n,k) encoder 300 designed to operate over GF($2^m$) (i.e., there are n-k check symbols, each symbol m bits long). The RS encoder 300 is constructed from a shift register similar to a conventional RS encoder 100. The multiplication, however, is performed utilizing a single multiplier 310.

The registers $R_0$–$R_{n-k-1}$, are connected serially, through m bit XOR gates $Add_0$–$Add_{n-k-2}$, to form a stage shift register. A latch stage 302 is introduced after the last stage of the shift register, $R_{n-k-1}$, The multiplier 310 is utilized to perform all the multiplication required for the encoding, and a timing mechanism 301 is introduced to enable control of the encoding rate. In one embodiment of the present invention, the latch stage 302 and timing mechanism 301 are optional. In another embodiment, the stage 302 and timing mechanism 301 are utilized.

In a similar fashion to the conventional encoder 100, the information symbols (m bits each) are input to the encoder input 133, one at a time. The feedback signal on the feedback line 130 is the result of the addition of the input signal on 133 and the content of the latch stage 302, where the addition operation is performed by the m bit XOR gate $Add_{n-k-1}$.

When a new information symbol is input to the encoder input 133, the timing mechanism 301 is triggered with a pulse, which is introduced on the timing mechanism input "Pulse In" 303 (the operations performed between consecutive information symbols inputs will be referred to hereinafter as a "symbol cycle"). The triggering pulse on 303 is fed into the clock input of the latch stage 302, and into the input of the D Flip Flop (DFF) identified as $DFF_{(n-k-2)/2}$. The triggering pulse on 303 causes the latch stage 302 to set its content to the content of the last stage of the shift register $R_{n-k-1}$, such that its content may now be altered. Since the latch stage 302 holds the symbol value of the last stage, the feedback signal calculation will yield a constant value over the entire symbol cycle.

Assuming that the state of each DFF is "0" when a symbol cycle is started, after a clock pulse is introduced on the clock input 304, the state of the $DFF_{(n-k-2)/2}$ will change to the value on the "pulse in" line 303, which is "1" at the beginning of a symbol cycle. The change in the state of the $DFF_{(n-k-2)/2}$ triggers the clock inputs of the shift registers $R_{n-k-1}$ and $R_{n-k-2}$, and therefore, their content is set to new values according to the following relationships, $R_{n-k-1} = R_{n-k-2} \oplus P_{n-k-1}$, and $R_{n-k-2} = R_{n-k-3} \oplus P_{n-k-2}$ (the GF addition, XOR, is represented by the symbol $\oplus$)

Figure 4:
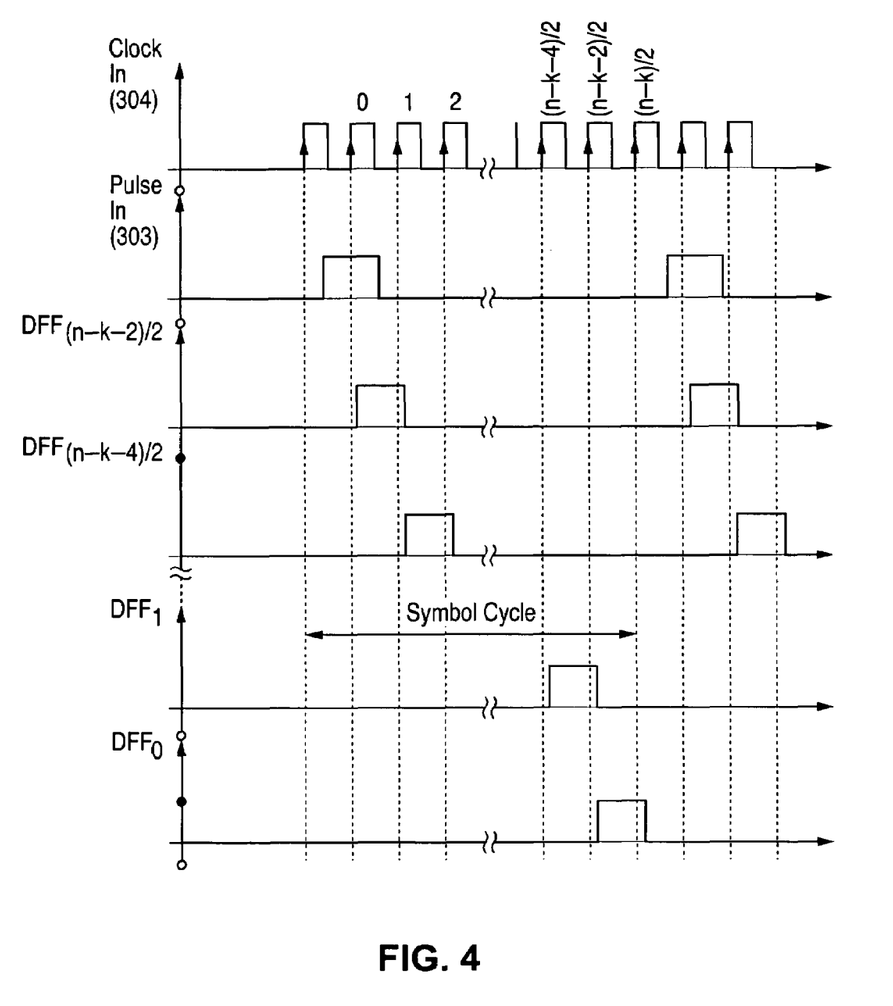
FIG. 4 schematically illustrates the timing mechanism of one embodiment of the invention, in the form of time diagrams.

Now referring to FIG. 4, in which the timing mechanism 301 is illustrated in the form of time diagrams, the first diagram shows the timing mechanism "clock in" on clock input 304. When a symbol cycle starts, the clock pulse, numerated as 0, causes the $DFF_{(n-k-2)/2}$ to lock on the "pulse in" signal on line 303, which is in the "high" state. When clock pulse 1 is applied, the $DFF_{(n-k-4)/2}$ state locks on the $DFF_{(n-k-2)/2}$ state and therefore goes into the "high" state. The $DFF_{(n-k-2)/2}$, however, locks again on the "pulse in" signal on the line 303, but since the signal on the line 303 dropped to the low state, the $DFF_{(n-k-2)/2}$ state reverts to its low state.

According to the above, when the $i^{th}$ clock pulse is applied to the timing mechanism 301, the $DFF_{(n-k-2-2^*i)/2}$ state changes from low to high, and the $DFF_{(n-k-2-2^*(i-1))/2}$ state changes from high to low (i=(n-k-2)/2, (n-k-4)/2, Y,2,1,0). Utilizing the above conventions, when a clock pulse numerated as i is applied to the DFFs, the value of the registers $R_{n-k-1-2^*i}$ and $R_{n-k-2-2^*i}$ is set according to the following formulas—$R_{n-k-1-2^*i} = R_{n-k-2-2^*i} \oplus P_{n-k-1-2^*i}$; $R_{n-k-2-2^*i} = R_{n-k-3-2^*i} \oplus P_{n-k-2-2^*i}$ (i=(n-k-2)/2,(n-k-4)/2,Y, 2,1,0 and $R_0 = P_0$).

The contents of the other registers, $R_x$ $_{(x \neq n-k-2-2^*i;\ x \neq n-k-1-2^*i)}$, are left unchanged during the $i^{th}$ clock cycle. In this fashion, the timing mechanism 301 triggers the shift register operation, such that the content of two consecutive registers is set whenever a clock pulse is applied on the clock input 304.

The timing mechanism 301 may be implemented utilizing different architectures and/or methods, such as multiplexing the clock pulses, or by connecting less than (n-k)/2 DFFs to increase the encoding rate. For example, the timing mechanism 301 of the invention may be implemented to comprise (n-k)/$2^L$ DFFs, where $t$=1,2, . . . ,α-1, or α' and where $_\alpha$ is the greatest integer such that $\alpha \leq log_2(n-k-1)$. However, in such embodiment, each DFF is utilized for controlling the timing of $2^t$, to which it is being connected. The main goal of this architecture is to increase the flexibility in the determination of the encoding rate.

Figure 5:
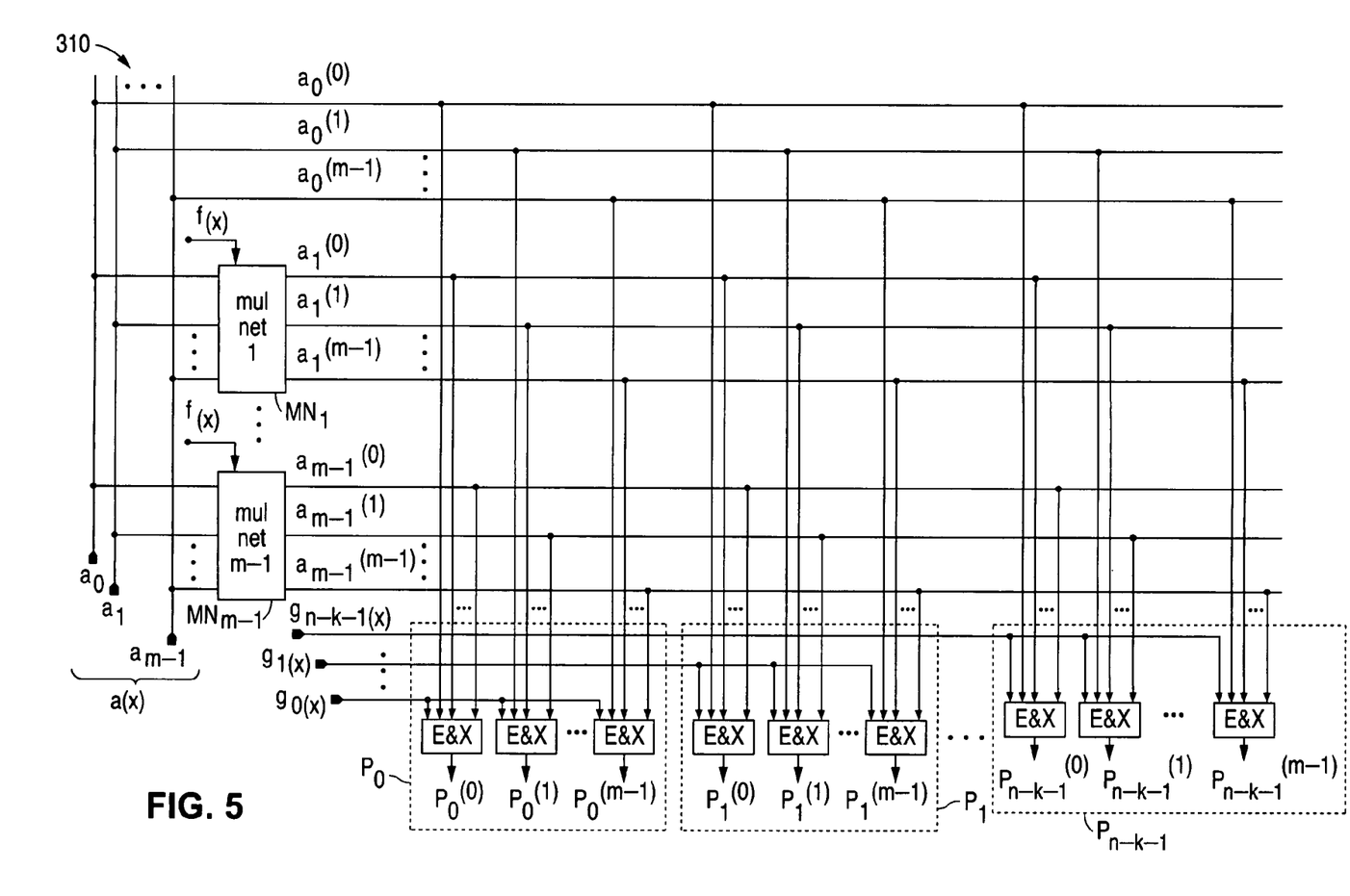
FIG. 5 schematically illustrates the present invention Galois multiplier architecture.

The structure of the multiplier 310 is schematically illustrated in FIG. 5. The multiplier 310 is designed to perform all the multiplication operations required in the encoding process. The multiplier 310 receives the feedback signal $a_{(x)}$, on the line 130 as its input, and the code generator polynomial coefficients as multiplicands, to generate all the products $P_0$–$P_{n-k-1}$, to be added by $Add_0$–$Add_{n-k-1}$.

Each of the multiplication result symbols $p_0$–$p_{n-k-1}$, is comprised from m bits which are the outputs of one of the Enable and XOR (E&X) units. The multiplication is performed through the MN units, $MN_1$–$MN_{m-1}$. An m bit symbol $a_I^{(0)}$–$a_i^{(m-1)}$ (i=0,1,Y,m-1), is produced by each of the MNs, and in order to construct a product symbol $p_j$ (j=0,1,Y,m-1), the symbols on the MN outputs are broken into individual bits that are collected in the E&X units in an LSB to MSB order. For example, the LSB of $p_0$, bit $p_0^{(0)}$, is generated by an E&X unit which takes all the LSB bits of the MN units outputs, $a_0^{(0)}$–$a_{m-1}^{(0)}$, as its input. Similarly, the MSB of $p_0$, bit $p_0^{(m-1)}$, is generated by the E&X unit, which takes all the MSB bits of the MN units outputs $a_0^{(m-1)}$–$a_{m-1}^{(m-1)}$, as its input.

The E&X units utilize the code generator polynomial coefficients, $g_0$–$g_{n-k-1}$, to enable or disable the input bits arriving from the MNs, $a_0^{(i)}$–$a_{m-1}^{(i)}$ (I=0, 1, Y, m-1). Each of the code generator polynomial coefficients is utilized for the calculation of a different product $p_J$ (j=0, 1, Y, m-1), to yield the desired multiplication $p_j = (g_{j(x)} \cdot a_{(x)})_{mod\ f(x)}$ (j=0,1, ..., n-k-1).

As will be appreciated by the person of ordinary skill in the art, a faster implementation of such GF multiplier is obtained when utilizing a constant field polynomial. More particularly, the multiplication networks $MN_1$–$MN_{m-1}$ may be designed to perform in a fixed GF. In this case, the MNs will receive only the feedback signal $a_{(x)}$ on line 130 as its input (i.e., bits $a_0$, $a_1$, Y, $a_{m-1}$), thereby each of the MNs will be implemented utilizing less logic. It should be clear that in a fixed GF multiplier implementation the multiplier g(x) will be flexible to carry out all the multiplication operations required, but over a predetermined GF only. This implementation is flexible enough for most implementations. The method of the present invention is applicable with any type of MNs. Although the specifications of the implementation depend on the MNs' performance, the method of the invention is not limited to any type of MNs.

FIG. 6 schematically illustrates the structure of the E&X units. In each of the E&X units, there are m logical AND gates, by which the MNs bits $a_0^{(i)}$–$a_{m-1}^{(i)}$ are enabled or disabled, according to the value of the generator polynomial $g_{j(x)}$ (j=0,1,Y,n-k-I) input to the E&X unit. The results of the logical AND operations are totaled by a logical XOR gate, which delivers the value of the $i^{th}$ bit of the j'th product result of the multiplier.

$$p_j^{(i)} = \sum_{r=0} g_j^{(r)} \cdot a_r^{(i)}$$

In this method, a single Galois-field multiplier 310 is capable of performing a plurality of multiplication operations, as required by the encoder 300. A substantial reduction in the number of MNs is achieved. The multiplier 310 illustrated in FIG. 5 is constructed from a total of m MN units, while in the conventional encoders (as shown in FIGS. 1 and 2) in which multiplication is performed utilizing m independent multipliers, a total of $m^*(n-k)$ MNs are required. Accordingly, the present invention provides a reduction in the number of MNs. As will be appreciated by those skilled in the art, the MNs are mainly constructed from logical XOR gates, such that reduction in the number of required MNs in such implementations provides a reduction in the number of gates, especially logical XOR gates.

Now referring to FIG. 7, there is shown a block diagram of a communication system 700 in accordance with the present invention. The communication system 700 includes a communications device 702 having the RS encoder 300 and a receiving device 704, in accordance with the present invention. The receiving device 704 may include a storage device such as hard disk, tape, CD, DVD or other storage medium (for storage), or other communications device(s) similar to the communications device 702.

The communication device 702 and receiving device 704 are coupled to a communications channel/network 706 and are operable for communicating (transmitting/receiving) data to/from, and across, the network 706. As will be appreciated, the network 706 is a LAN, WAN, private network, intranet, internet or some other telecommunication network, including wireless, or other network capable of communicating data from one point to another point. The communications system 700 may be operable and functional for wireless, mobile, and satellite communications, or other communications within a computer system or between computer systems, or between any communicating devices where RS encoding may be utilized.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. An apparatus for encoding data, comprising:
   an input for receiving a plurality of information symbols;
   an encoder for generating a code word, the code word comprising the plurality of information symbols and at least one check symbol, the encoder comprising:
   a stage shift register having at least one register and at least one adder; and
   a single Galois Field ("GF") multiplier capable of multiplying an output symbol of the stage shift register with coefficients of a code generator polynomial, the GF multiplier comprising:
   a plurality of multiplication networks capable of generating a plurality of multiplication results, the multiplication networks operable to use the output symbol and a field polynomial to generate the multiplication results; and
   a plurality of partial product units capable of generating a plurality of partial products for input to the at least one adder, each partial product unit operable to receive at least a portion of each of the multiplication results and one of the code generator polynomial coefficients; and
   an output for outputting the code word.

2. The apparatus in accordance with claim 1, wherein the partial product units are capable of utilizing the code generator polynomial coefficients to enable or disable each bit of the multiplication results to generate the partial products.

3. The apparatus in accordance with claim 2, wherein each of the partial product units comprises at least one enable and XOR unit.

4. The apparatus in accordance with claim 1, wherein the encoder further comprises timing circuitry for controlling an encoding rate of the encoder.

5. The apparatus in accordance with claim 4, wherein the timing circuitry comprises at least one flip-flop capable of receiving a clock input and a pulse input and outputting a signal for latching the at least one register.

6. An encoder, comprising:
an input for receiving a plurality of symbols;
an ordered set of adders including a last adder and one or more additional adders, each adder having a first input, a second input and an output, the ordered set of adders connected to an ordered set of registers, each register having an input and an output, wherein:
the output of each register is coupled to the second input of an associated one of the adders;
the output of each additional adder is coupled to the input of an associated one of the registers; and
the first input of the last adder is connected to the input for receiving the plurality of symbols;
a first arbitration device having an input coupled to the output of the last adder and an output connected to an input of a single Galois Field ("GF") multiplier, wherein the first arbitration device is operable to produce an output symbol being equal to the input of the first arbitration device in a first state and to zero in a second state, wherein the GF multiplier is capable of simultaneously multiplying the output symbol with coefficients of a code generator polynomial, the GF multiplier comprising:
an ordered set of multiplication networks capable of generating a plurality of multiplication results, the multiplication networks capable of using the output symbol and a field polynomial to generate the multiplication results; and
an ordered set of partial product units capable of producing a plurality of partial products, each partial product unit operable to receive one of the coefficients of the code generator polynomial and at least a portion of each of the multiplication results, the partial products provided to the first input of the one or more additional adders; and
a second arbitration device having a first input coupled to the input for receiving the plurality of symbols and a second input coupled to the output of the last adder, the second arbitration device capable of producing an output that equals at least one of the plurality of symbols in a first state and the output of the last adder in a second state.

7. The encoder in accordance with claim 6, further comprising timing circuitry for controlling a capture operation at the input of each register.

8. The encoder in accordance with claim 7, wherein the timing circuitry comprises:
an ordered set of D-Flip-Flops including a last D-Flip-Flop and one or more additional D-Flip-Flops, each D-Flip-Flop having a first input for receiving a clock pulse signal, a second input, and an output; and
a latch register having a first input for receiving a triggering pulse, a second input, and an output;
wherein:
the output of each additional D-Flip-Flop is coupled to the second input of a following D-Flip-Flop;
the triggering pulse is coupled to the second input of a first D-Flip-Flop in the ordered set of D-Flip-Flops;
the output of the last D-Flip-Flop is coupled to a timing input of each of a first two registers in the ordered set of registers;
the output of the last register is coupled to the second input of the latch register; and
the output of the latch register is coupled to the second input of the last adder.

9. The encoder in accordance with claim 6, wherein each partial product unit comprises an ordered set of logical units, wherein:
each logical unit is capable of receiving one of the coefficients of the code generator polynomial as input;
each logical unit is also capable of receiving at least the portion of each of the multiplication results from the multiplication networks as input; and
the logical units are capable of outputting the partial products to the adders.

10. A communications device, comprising:
an encoding apparatus, comprising:
an input for receiving a plurality of information symbols;
an encoder for generating a code word, the code word comprising the plurality of information symbols and at least one check symbol, the encoder comprising:
a stage shift register having at least one register and at least one adder; and
a single Galois Field ("GF") multiplier capable of multiplying an output symbol of the stage shift register with coefficients of a code generator polynomial, the GF multiplier comprising:
a plurality of multiplication networks capable of generating a plurality of multiplication results, the multiplication networks operable to use the output symbol and a field polynomial to generate the multiplication results; and
a plurality of partial product units capable of generating a plurality of partial products for input to the at least one adder, each partial product unit operable to receive at least a portion of each of the multiplication results and one of the code generator polynomial coefficients; and
an output for outputting the code word.

11. The communications device in accordance with claim 10, wherein the code word is transmitted over a communications network.

12. The apparatus of claim 3, wherein each enable and XOR unit comprises:
a plurality of AND gates, each AND gate capable of receiving a bit from a different one of the multiplication results, each AND gate also capable of receiving a different bit from one of the code generator polynomial coefficients; and
an XOR gate capable of receiving outputs from the AND gates, an output of the XOR gate representing a bit in one of the partial products.

13. The encoder of claim 9, wherein each of the logical units comprises:
a plurality of AND gates, each AND gate capable of receiving a bit from a different one of the multiplication results, each AND gate also capable of receiving a different bit from one of the code generator polynomial coefficients; and
an XOR gate capable of receiving outputs from and AND gates, an output of the XOR gate representing a bit in one of the partial products.

14. The communications device of claim 10, wherein the at least one adder comprises a plurality of adders, and further comprising:
- an arbitrator capable of producing an output symbol that is equal to an input of the arbitrator in a first state and to zero in a second state, the input of the arbitrator coupled to an output of a last of the plurality of adders.

15. The communications device of claim 14, wherein each of the partial product units comprises a plurality of logical units, each logical unit comprising:
- a plurality of AND gates, each AND gate capable of receiving a bit from a different one of the multiplication results, each AND gate also capable of receiving a different bit from one of the code generator polynomial coefficients; and
- an XOR gate capable of receiving outputs from the AND gates, an output of the XOR gate representing a bit in one of the partial products.

16. The communications device of claim 10, wherein the at least one register comprises a plurality of registers, and further comprising:
- timing circuitry capable of outputting at least one signal for controlling the registers.

17. The communications device of claim 16, wherein the timing circuitry comprises:
- a plurality of D-Flip-Flops including a last D-Flip-Flop and one or more additional D-Flip-Flops, each D-Flip-Flop having a first input for receiving a clock signal, a second input, and an output; and
- a latch register having a first input for receiving a triggering pulse, a second input, and an output;

wherein:
- the output of each additional D-Flip-Flop is coupled to the second input of a following D-Flip-Flop;
- the triggering pulse is coupled to the second input of a first D-Flip-Flop in the ordered set of D-Flip-Flops;
- the output of the last D-Flip-Flop is coupled to a timing input of each of a first two registers in the ordered set of registers;
- the output of the last register is coupled to the second input of the latch register; and
- the output of the latch register is coupled to the second input of the last adder.

18. The apparatus of claim 1, wherein each partial product unit is capable of receiving at least a portion of the output symbol, at least a portion of each of the multiplication results, and one of the code generator polynomial coefficients.

19. The encoder of claim 6, wherein each partial product unit is capable of receiving at least a portion of the output symbol, at least a portion of each of the multiplication results, and one of the code generator polynomial coefficients.

20. The communications device of claim 10, wherein each partial product unit is capable of receiving at least a portion of the output symbol, at least a portion of each of the multiplication results, and one of the code generator polynomial coefficients.

* * * * *

UNITED STATES PATENT AND TRADEMARK OFFICE
CERTIFICATE OF CORRECTION

PATENT NO. : 7,178,091 B1 Page 1 of 1
APPLICATION NO. : 10/192761
DATED : February 13, 2007
INVENTOR(S) : Moshe Alon It is certified that error appears in the above-identified patent and that said Letters Patent is hereby corrected as shown below:

Column 2, line 55, delete "$Mul_0$-$Mul_{n\cdot k\text{-}1}$" and replace with -- $Mul_0$-$Mul_{n\text{-}k\text{-}1}$ --;

Column 3, line 54, delete "[[$MN_0$,]]" and delete "[[-1]]";

Column 3, line 61, delete "$g_{j(x)}$ (0 [[529 ]] $\leq$ j [[| |]] $\leq$ n-k-1)" and replace with -- $g_{j(x)}$ (0 $\leq$ j $\leq$ n-k-1) --;

Column 6, line 62, delete "$(n\text{-}k)/2^L$" and replace with -- $(n\text{-}k)/2^t$ --;

Column 7, line 11, delete "$MN_1$-$MN_{M\text{-}1}$" and replace with -- $MN_0$-$MN_{M\text{-}1}$ --;

Column 7, line 12, delete "$a_1^{(0)}$-$a_i^{(m\text{-}1)}$" and replace with -- $ai^{(0)}$-$a_i^{(m\text{-}1)}$ --;

Column 7, line 24, delete "$a_0^{(i)}$-$a_{m\text{-}1}^{(i)}$ $_{(I=0,\, 1,\, Y,\, m\text{-}1)}$" and replace with -- $a_0^{(i)}$-$a_{m\text{-}1}^{(i)}$ $_{(i=0,\, 1,\, Y,\, m\text{-}1)}$ --.

Signed and Sealed this

Sixteenth Day of October, 2007

JON W. DUDAS
*Director of the United States Patent and Trademark Office*